(12) United States Patent
Yang et al.

(10) Patent No.: US 11,832,375 B2
(45) Date of Patent: Nov. 28, 2023

(54) FLATTENING STRUCTURE OF FLEXIBLE SCREEN, AND DISPLAY DEVICE

(71) Applicant: BOE Technology Group Co., Ltd., Beijing (CN)

(72) Inventors: Yanyan Yang, Beijing (CN); Yonghong Zhou, Beijing (CN); Shangchieh Chu, Beijing (CN); Xiaofei Luo, Beijing (CN); Hong Zhu, Beijing (CN); Shouchuan Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 18 days.

(21) Appl. No.: 17/634,041

(22) PCT Filed: Mar. 22, 2021

(86) PCT No.: PCT/CN2021/082157
§ 371 (c)(1),
(2) Date: Feb. 9, 2022

(87) PCT Pub. No.: WO2021/227663
PCT Pub. Date: Nov. 18, 2021

(65) Prior Publication Data
US 2023/0056590 A1 Feb. 23, 2023

(30) Foreign Application Priority Data
May 13, 2020 (CN) .......................... 202010403238.4

(51) Int. Cl.
H05K 5/02 (2006.01)
(52) U.S. Cl.
CPC ................................ H05K 5/0221 (2013.01)

(58) Field of Classification Search
CPC ...................................................... H05K 7/00
See application file for complete search history.

(56) References Cited

U.S. PATENT DOCUMENTS

2007/0180745 A1 8/2007 Ofuji et al.
2017/0325343 A1* 11/2017 Seo .................. G03B 21/58
(Continued)

FOREIGN PATENT DOCUMENTS

| CN | 1926595 A | 3/2007 |
|---|---|---|
| CN | 106601129 A | 4/2017 |

(Continued)

OTHER PUBLICATIONS

CN202010403238.4 first office action.
CN202010403238.4 second office action.
CN202010403238.4 Decision of Rejection.

*Primary Examiner* — Jerry Wu
(74) *Attorney, Agent, or Firm* — IPro, PLLC

(57) ABSTRACT

A flattening structure of a flexible screen (100), and a display device. The flattening structure includes a flexible screen storage device (200), a storage blocking member (300), and an elastic assembly (400), the flexible screen storage device (200) includes a housing (201) and a flexible screen reel (202) arranged in the housing (201); one end of the flexible screen (100) is connected to the flexible screen reel (202) and capable of being wound on the flexible screen reel (202), and the other end of the flexible screen (100) is connected to the storage blocking member (300) by means of the elastic assembly (400).

12 Claims, 5 Drawing Sheets

(56) References Cited

U.S. PATENT DOCUMENTS

| | | |
|---|---|---|
| 2017/0365197 A1 | 12/2017 | Kim et al. |
| 2017/0367198 A1 | 12/2017 | Park et al. |
| 2018/0181164 A1 | 6/2018 | Chen |
| 2019/0182947 A1 | 6/2019 | Xiang et al. |
| 2020/0126457 A1 | 4/2020 | Wang |
| 2022/0240400 A1 | 7/2022 | Zhou |

FOREIGN PATENT DOCUMENTS

| | | |
|---|---|---|
| CN | 106847103 A | 6/2017 |
| CN | 107067981 A | 8/2017 |
| CN | 107331301 A | 11/2017 |
| CN | 107527552 A | 12/2017 |
| CN | 110599912 A | 12/2019 |
| CN | 110853524 A | 2/2020 |
| CN | 210467103 U | 5/2020 |
| CN | 111462633 A | 7/2020 |
| KR | 20170134844 A | 12/2017 |

\* cited by examiner

FLATTENING STRUCTURE OF FLEXIBLE SCREEN, AND DISPLAY DEVICE

CROSS REFERENCE TO RELATED APPLICATIONS

The present disclosure is a national phase entry under 35 U.S.C § 371 of International Application No. PCT/CN2021/082157, filed Mar. 22, 2021, which claims priority to Chinese patent application No. 202010403238.4 filed on May 13, 2020 to the China National Intellectual Property Administration, and entitled "FLATTENING STRUCTURE OF FLEXIBLE SCREEN, AND DISPLAY DEVICE", the entire content of which is incorporated herein by reference.

FIELD

The present disclosure relates to the field of display, in particular to a flattening structure of a flexible screen, and a display apparatus.

BACKGROUND

With the progress of science and technology and the development of society, flexible display panels have gradually entered the vision of consumers. The bendable and flexible panels not only facilitate consumers' life, but also bring the consumers new user experience.

However, one of the problems of an existing flexible display screen is that the screen bulges easily when flattened, which makes the display effect poor and affects the viewing experience of users.

SUMMARY

Embodiments of the present disclosure provide a flattening structure of a flexible screen, including:

a flexible screen storage apparatus, including a housing and a flexible screen reel arranged in the housing; the flexible screen reel is connected with one end of the flexible screen and capable of being wound by the flexible screen;

a storage blocking member arranged opposite to the flexible screen storage apparatus; and at least one elastic assembly connecting the storage blocking member with another one end of the flexible screen.

In a possible implementation, according to the flattening structure provided by the embodiments of the present disclosure, the another one end of the flexible screen is fixedly connected with a sliding assembly, and the sliding assembly is connected with one end, away from the storage blocking member, of the at least one elastic assembly.

In a possible implementation, according to the flattening structure provided by the embodiments of the present disclosure, the sliding assembly is a sliding plate, and the sliding plate completely covers the flexible screen in a direction perpendicular to an unfolding direction of the flexible screen.

In a possible implementation, according to the flattening structure provided by the embodiments of the present disclosure, the storage blocking member is provided with a sliding groove, and the sliding assembly is slidably matched with the sliding groove.

In a possible implementation, according to the flattening structure provided by the embodiments of the present disclosure, two ends of the sliding groove corresponding to the direction perpendicular to the unfolding direction of the flexible screen are provided with guide parts, and an edge of the sliding assembly is matched and connected with the guide parts.

In a possible implementation, according to the flattening structure provided by the embodiments of the present disclosure, one elastic assembly is connected to a middle position of the sliding assembly in a direction perpendicular to an unfolding direction of the flexible screen.

In a possible implementation, according to the flattening structure provided by the embodiments of the present disclosure, two elastic assemblies are symmetrically connected on both sides of the sliding assembly.

In a possible implementation, according to the flattening structure provided by the embodiments of the present disclosure, the flexible screen storage apparatus is further internally provided with a flexible screen winding driving apparatus.

In a possible implementation, according to the flattening structure provided by the embodiments of the present disclosure, a locking apparatus is further arranged in the flexible screen storage apparatus, and the locking apparatus is configured to limit an action of the flexible screen.

In a possible implementation, according to the flattening structure provided by the embodiments of the present disclosure, the storage blocking member is a rigid display unit.

In another aspect, the embodiments of the present disclosure further provide a display apparatus, including a flexible screen and any one of the flattening structures of the flexible screen mentioned above.

DETAILED DESCRIPTION OF THE EMBODIMENTS

Figure 1:
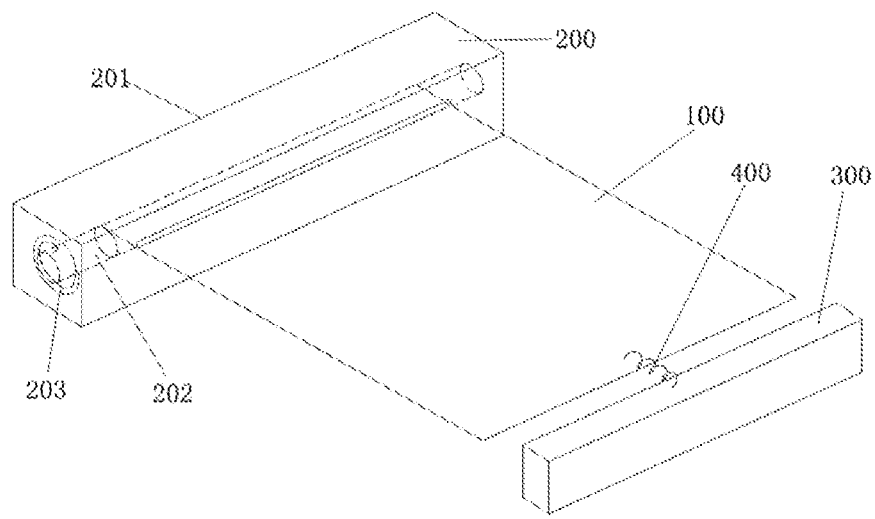
FIG. 1 is a stereo view of a flattening structure of a flexible screen provided by an embodiment of the present disclosure.

The present disclosure will be further described in detail below with reference to the accompanying drawings and embodiments. It can be understood that the specific embodiments described herein are only used to explain the relevant invention instead of limiting the invention. It should also be noted that, for ease of description, only parts related to the invention are shown in the drawings.

The terms "first", "second", and similar words used in the present disclosure do not denote any order, quantity, or importance, but rather are used solely to distinguish one from another. Similar words such as "include" or "contain" mean that elements before the word cover elements listed after the word, and do not exclude the possibility of covering other elements. The terms "upper", "lower", "left", "right" and the like are used merely to denote a relative positional relationship that may change accordingly when the absolute position of a described object changes.

Figure 2:
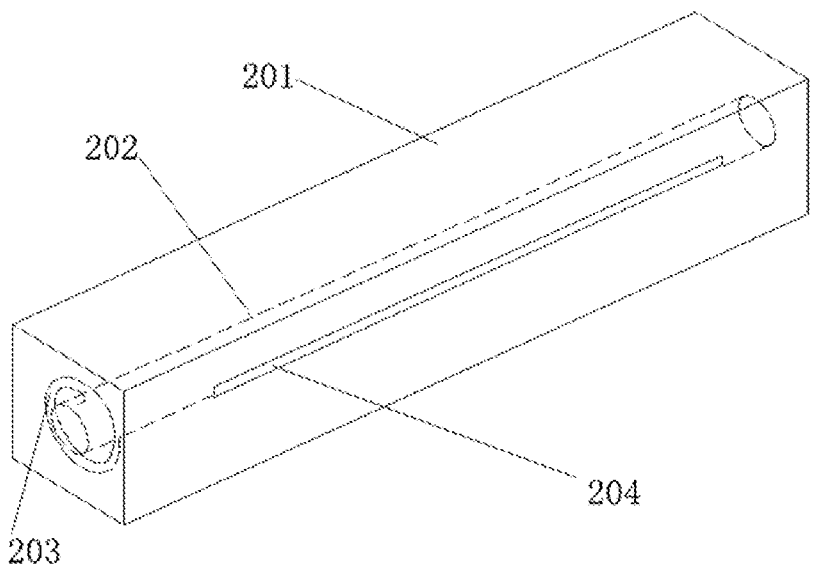
FIG. 2 is a structural diagram of a flexible screen storage apparatus in a flattening structure provided by an embodiment of the present disclosure.
Figure 3:
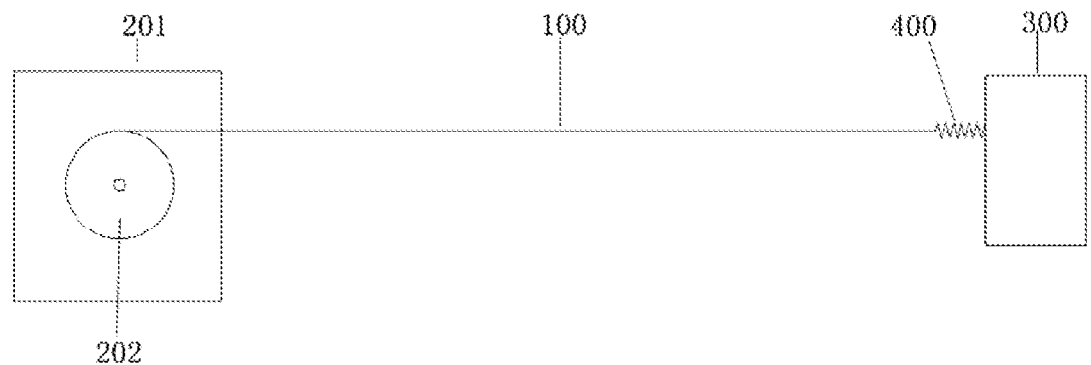
FIG. 3 is a side view of a flattening structure of a flexible screen provided by an embodiment of the present disclosure.

As shown in FIG. 1 to FIG. 3, the embodiments of the present disclosure provide a flattening structure of a flexible screen, including a flexible screen storage apparatus 200, a storage blocking member 300, and elastic assemblies 400; the flexible screen storage apparatus 200 includes a housing 201 and a flexible screen reel 202 arranged in the housing. One end of the flexible screen 100 is connected with the flexible screen reel 202 and may be wound on the flexible screen reel 202. Another one end of the flexible screen 100 is connected with the storage blocking member 300 through at least one elastic assembly 400.

Accordingly, when it is necessary to store the flexible screen 100, the flexible screen 100 may be wound on the flexible screen reel 202 in the flexible screen storage apparatus 200, and the storage blocking member 300 may limit the another one end of the flexible screen 100 to be also stored in the flexible screen storage apparatus 200. When it is necessary to expand the flexible screen 100, by applying a force to the storage blocking member 300 in a direction away from the flexible screen storage apparatus 200, the flexible screen 100 can be unwound from the flexible screen reel 202 and extended and unfolded from the flexible screen storage apparatus 200, and force application may stop after the storage blocking member 300 reaches a predetermined position.

Research shows that a bulge of a screen of the flexible screen 100 is caused by uneven stress distribution at a junction of unfolding and winding positions. By adopting the flattening structure provided by the embodiments of the present disclosure, when the screen bulge is about to occur at the junction of the unfolding and winding positions of the flexible screen 100, the flexible screen 100 tends to elongate the at least one elastic assembly 400, so that the elastic assemblies 400 generate an elastic tension on the flexible screen 100, flatness of the flexible screen 100 from beginning to end is ensured, and occurrence of the screen bulge is avoided.

Figure 4:
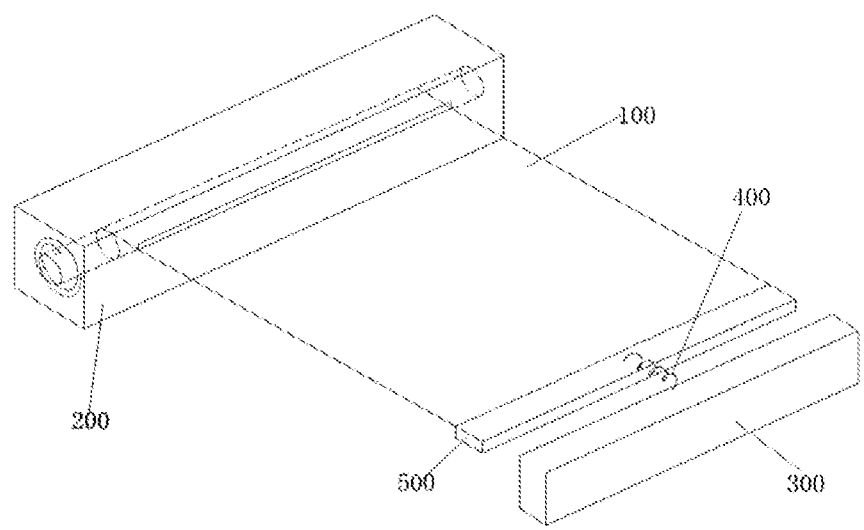
FIG. 4 is another stereo view of a flattening structure of a flexible screen provided by an embodiment of the present disclosure.
Figure 5:
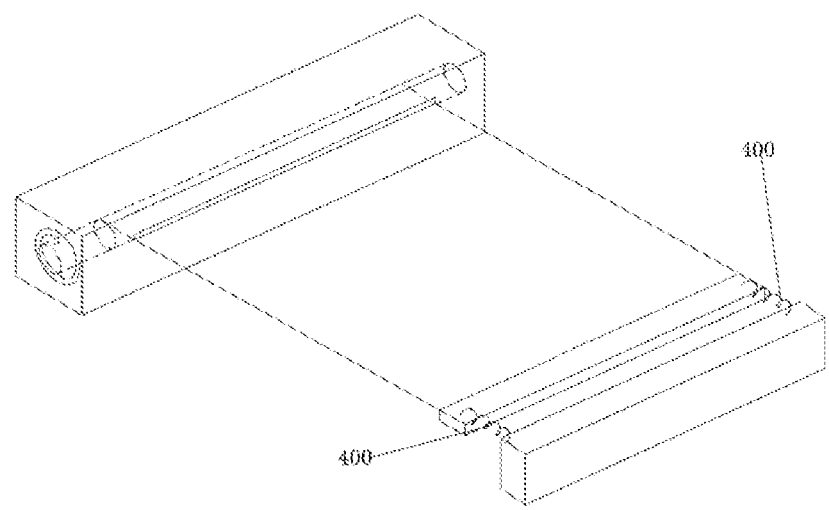
FIG. 5 is another stereo view of a flattening structure of a flexible screen provided by an embodiment of the present disclosure.
Figure 6:
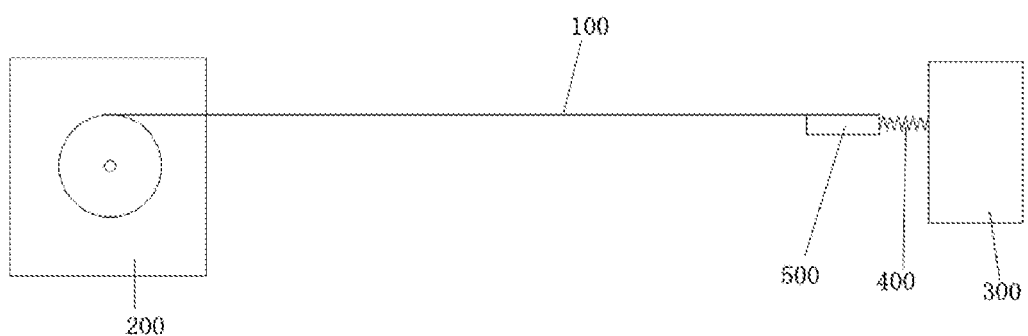
FIG. 6 is another side view of a flattening structure of a flexible screen provided by an embodiment of the present disclosure.

Optionally, in the flattening structure provided by the embodiments of the present disclosure, as shown in FIG. 4 to FIG. 6, one end of the at least one elastic assembly 400 away from the storage blocking member 300 is connected with a sliding assembly 500, and the sliding assembly 500 is fixed to one end of the flexible screen 100 away from the flexible screen reel 202.

Optionally, in the flattening structure provided by the embodiments of the present disclosure, the sliding assembly 500 may be a sliding plate, and the sliding plate completely covers the flexible screen 100 in a direction perpendicular to an unfolding direction of the flexible screen 100. Through the arrangement, one end of the flexible screen 100 may completely fit with the sliding assembly 500, so as to ensure a balanced tension of the whole flexible screen 100, no local deformation and damage exist during the unfolding of the flexible screen 100, and no local unevenness exists after the unfolding.

Figure 7:
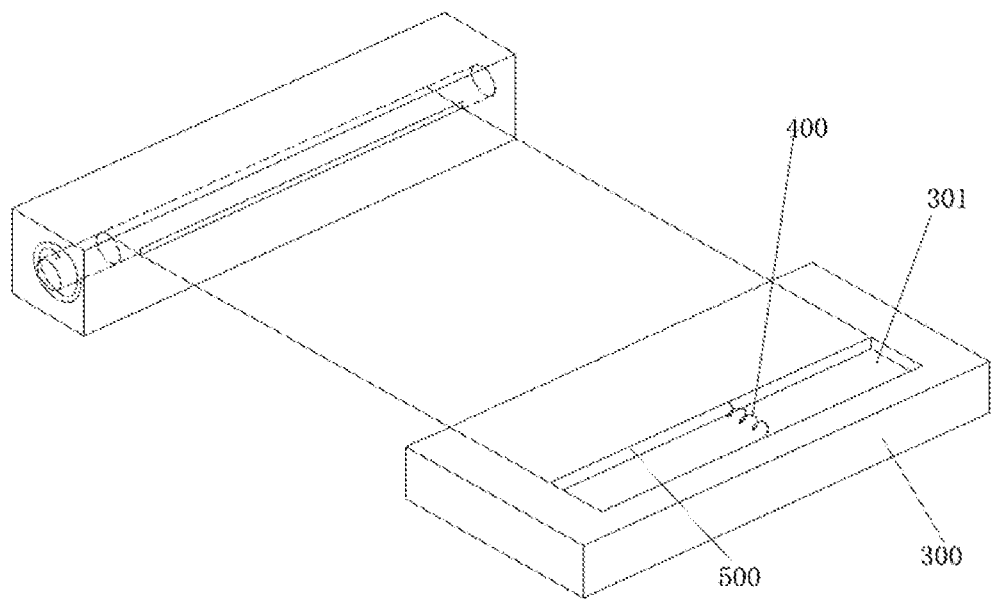
FIG. 7 is another stereo view of a flattening structure of a flexible screen provided by an embodiment of the present disclosure.
Figure 8:
FIG. 8 is another side view of a flattening structure of a flexible screen provided by an embodiment of the present disclosure.

Optionally, in the flattening structure provided by the embodiments of the present disclosure, as shown in FIG. 7 to FIG. 8, the storage blocking member 300 is provided with a sliding groove 301, and the sliding assembly 500 is slidably matched with the sliding groove 301.

Figure 9:
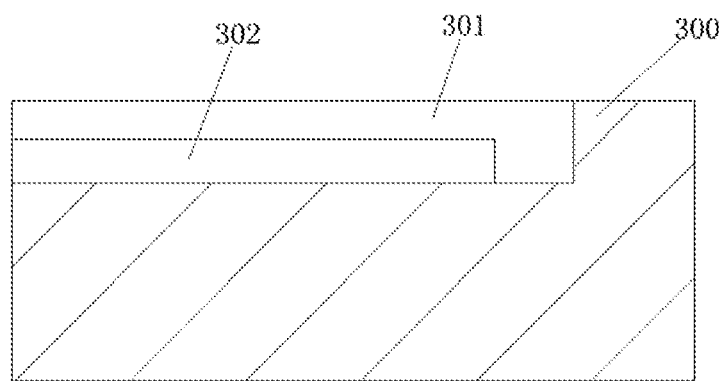
FIG. 9 is a section view of a storage blocking member in a flattening structure provided by an embodiment of the present disclosure.

Optionally, in the flattening structure provided by the embodiments of the present disclosure, as shown in FIG. 9, two ends of the sliding groove 301 corresponding to the direction perpendicular to the unfolding direction of the flexible screen 100 are provided with guide parts 302, and an edge of the sliding assembly 500 is matched and connected with the guide parts 302. The guide parts 302 are configured to guide the sliding assembly 500. By arranging the guide parts 302, an action of the sliding assembly 500 is smoother.

Optionally, in the flattening structure provided by the embodiments of the present disclosure, the guide parts 302 may be sliding rails or guide grooves specifically.

Optionally, in the flattening structure provided by the embodiments of the present disclosure, the at least one elastic assembly 400 may be an elastic piece or a spring or a combination thereof. Optionally, the quantity of the elastic assembly 400 may be two or more.

Optionally, in the flattening structure provided by the embodiments of the present disclosure, as shown in FIG. 4, one elastic assembly 400 may be provided, and the one elastic assembly 400 is connected to a middle position of the sliding assembly 500 in the direction perpendicular to the unfolding direction of the flexible screen 100.

Or, optionally, in the flattening structure provided by the embodiments of the present disclosure, as shown in FIG. 5, two elastic assemblies 400 may be provided, and the two elastic assemblies 400 are connected on both sides of the sliding assembly 500, and the two elastic assemblies 400 are preferably arranged symmetrically.

Accordingly, a point at which the elastic assemblies 400 apply force to the sliding assembly 500 is in the middle position of the flexible screen 100 in the direction perpendicular to the unfolding direction or is symmetrical along the middle position, so that the sliding assembly 500 will not generate a torque relative to its center, and then will not deflect, so that the force applied to each position of the flexible screen 100 is uniform.

Optionally, in the flattening structure provided by the embodiments of the present disclosure, as shown in FIG. 2, the flexible screen storage apparatus 200 may be internally provided with a flexible screen winding driving apparatus 203 configured to provide a force to rotate the flexible screen reel 202. Specifically, the flexible screen winding driving apparatus 203 may be a torsion spring.

Optionally, in the flattening structure provided by the embodiments of the present disclosure, as shown in FIG. 2, the flexible screen storage apparatus 200 has an opening 204 allowing the flexible screen 100 to come in and go out, and a size of the storage blocking member 300 is larger than a size of the opening 204 in at least one direction so that the storage blocking member 300 cannot enter the opening 204.

Optionally, in the flattening structure provided by the embodiments of the present disclosure, a locking apparatus (not shown) is further arranged in the flexible screen storage apparatus 200, and the locking apparatus is configured to lock an action of the flexible screen 100. Specifically, the locking apparatus is an apparatus that limits a rotation of the flexible screen reel 202, and a locking can be canceled under an action of an action part.

Optionally, in the flattening structure provided by the embodiments of the present disclosure, as shown in FIG. 7 to FIG. 10, the storage blocking member 300 may be a rigid display unit such as a mobile phone, a laptop, a digital terminal and the like. At this time, the flexible screen 100 may be configured to be an auxiliary display component of the rigid display unit such as the mobile phone. When a large screen display is not required, a mobile phone screen can be used alone. When the large screen display is required, the flexible screen 100 may be unfolded from the flexible screen storage apparatus 200.

Figure 10:
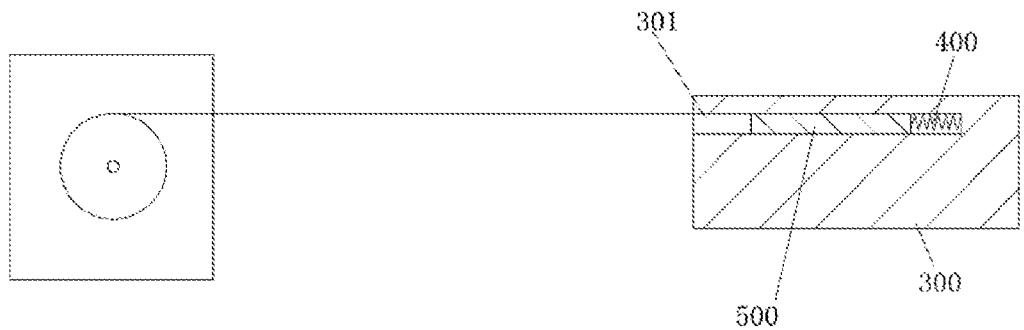
FIG. 10 is another side view of a flattening structure of a flexible screen provided by an embodiment of the present disclosure.

Optionally, in the flattening structure provided by the embodiment of the present disclosure, as shown in FIG. 10, the sliding groove 301 has an opening only on a surface of the storage blocking member 300 facing the flexible screen storage apparatus 200. At this time, an action of the sliding plate in a direction perpendicular to a sliding surface may be limited to avoid unnecessary displacement of the sliding plate and reduce the risk that a device cannot work normally.

Based on the same invention, the embodiments of the present disclosure further provide a display apparatus, including a flexible screen 100 and the above flattening structure provided by the embodiment of the present disclosure.

A specific solution of the display apparatus provided by the embodiments of the present disclosure is described below with reference to the accompanying drawings; the display apparatus includes a rigid display unit, a flexible screen 100, a flexible screen storage apparatus 200, a spring, and a sliding plate, and the rigid display unit is configured to be a storage blocking member 300.

The flexible screen storage apparatus 200 includes a housing 201, a flexible screen reel 202 arranged in the housing, a torsion spring 203 driving the flexible screen reel 202 to rotate, and a locking apparatus limiting the rotation of the flexible screen reel 202. One end of the flexible screen 100 is connected with the flexible screen reel 202 and may be wound on the flexible screen reel 202. An opening 204 is formed in the housing for the flexible screen 100 to come in and go out the housing 201.

The another one end of the flexible screen 100 is fixedly connected with the sliding plate, and the sliding plate completely covers the flexible screen 100 in a direction perpendicular to an unfolding direction of the flexible screen 100.

The storage blocking member 300 is provided with a sliding groove 301 for the sliding plate to slide therein. Guide grooves 302 are formed in both side walls of the sliding groove 301 (perpendicular to the unfolding direction of the flexible screen 100, that is, perpendicular to a sliding direction of the sliding plate).

An edge of the sliding plate is matched and connected with the guide grooves 302 to guide the sliding of the sliding plate.

The sliding plate and an edge of the sliding groove 301 are connected by the spring to apply a tension to the sliding plate.

When the above display apparatus provided by the embodiments of the present disclosure works:

when a display screen of the rigid display unit is sufficient to use and the flexible screen 100 does not need to be used, the flexible screen 100 remains wound in the flexible screen storage apparatus 200.

When the flexible screen 100 needs to be unfolded, a limitation of the locking apparatus on the rotation of the flexible screen reel 202 is released firstly, and then a force is applied in an opposite direction through the rigid display unit and the flexible screen storage apparatus 200. When the force is greater than an elastic force of the torsion spring 203, the flexible screen 100 may be unwound from the flexible screen reel 202 and extended and unfolded from the opening 204 of the flexible screen storage apparatus 200. When an unfolding size of the flexible screen 100 reaches a predetermined value, force application stops, and then the locking apparatus is controlled to limit the rotation of the flexible screen reel 202. At this time, the spring continuously applies the tension to the flexible screen 100 to ensure flatness of the expanded flexible screen. When a partial position of the flexible screen 100 tends to deform due to stress problems (for example, when the screen bulges at a junction of flexible screen unfolding and winding positions), the trend makes the flexible screen 100 drive the sliding plate to slide along the sliding groove 301, which increases a deformation of the spring, resulting in an increase in the tension of the spring on the sliding plate. The tension is conducive to flattening the flexible screen 100 at a deformation position, avoiding a bulge of the flexible screen 100, and further improving the flatness of the flexible screen when it is unfolded.

When the flexible screen 100 needs to be stored, the limitation of the locking apparatus on the rotation of the flexible screen reel 202 is released firstly, and the torsion spring 203 applies the force to the flexible screen reel 202 to make the flexible screen reel 202 rotate, so as to drive the flexible screen 100 to be wound on the flexible screen reel 202. After the rigid display unit makes contact with the housing 201 of the flexible screen storage apparatus 200, a winding action stops.

Optionally, in order to prevent the torsion spring 203 from always applying the force on the flexible screen reel 202 and make the flexible screen 100 drive the rigid display unit and the housing 201 of the flexible screen storage apparatus 200 to bear the force, the rotation of the flexible screen reel 202 may be limited by the locking apparatus before or just when the rigid display unit makes contact with the housing 201, so as to release the tension of the flexible screen 100.

The above description is only a better embodiment of the present disclosure and a description of the applied technical principles. Those skilled in the art should understand that the disclosure scope involved in this disclosure is not limited to the technical solutions formed by the specific combination of the above technical features, but also covers other technical solutions formed by the arbitrary combination of the above technical features or their equivalent features without departing from the above disclosure concept, such as a technical solution formed by replacing the above features with (but not limited to) the technical features with similar functions disclosed in the present disclosure.

What is claimed is:

1. A flattening structure of a flexible screen, comprising: a flexible screen storage apparatus, comprising a housing and a flexible screen reel arranged in the housing, wherein the flexible screen reel is connected with one end of the flexible screen and capable of being wound by the flexible screen; a storage blocking member arranged opposite to the flexible screen storage apparatus; and at least one elastic assembly connecting the storage blocking member with another one end of the flexible screen; wherein the another one end of the flexible screen is fixedly connected with a sliding assembly, and the sliding assembly is connected with a first end, away from the storage blocking member, of the at least one elastic assembly; and wherein the sliding assembly is a sliding plate, and the sliding plate completely covers the flexible screen in a direction perpendicular to an unfolding direction of the flexible screen; and the storage blocking member is provided with a sliding groove, and the sliding assembly slides in the sliding groove when the storage block member pulls a second end of the at least one elastic assembly opposite to the first end; and two ends of the sliding groove corresponding to a direction perpendicular to an unfolding direction of the flexible screen are provided with guide rails, and an edge of the sliding assembly is sided along the guide rails.

2. The flattening structure of the flexible screen according to claim 1, wherein the at least one elastic assembly comprises one elastic assembly, and the one elastic assembly is connected to a middle position of the sliding assembly in a direction perpendicular to an unfolding direction of the flexible screen.

3. The flattening structure of the flexible screen according to claim 1, wherein the at least one elastic assembly comprises two elastic assemblies, the two elastic assemblies are arranged at two end of a side, facing the storage blocking member, of the sliding assembly, and the two elastic assemblies are symmetrical.

4. The flattening structure of the flexible screen according to claim 1, wherein the flexible screen storage apparatus is further provided with a flexible screen winding driving apparatus.

5. The flattening structure of the flexible screen according to claim 1, wherein a locking apparatus is further arranged in the flexible screen storage apparatus, and the locking apparatus is configured to limit an action of the flexible screen.

6. The flattening structure of the flexible screen according to claim 1, wherein the storage blocking member is a rigid display device.

7. A display apparatus, comprising a flexible screen and a flattening structure of the flexible screen; wherein the flattening structure of the flexible screen, comprising: a flexible screen storage apparatus, comprising a housing and a flexible screen reel arranged in the housing, wherein the flexible screen reel is connected with a first end of the flexible screen and capable of being wound by the flexible screen; a storage blocking member arranged opposite to the flexible screen storage apparatus; and at least one elastic assembly connecting the storage blocking member with another one end of the flexible screen wherein the another one end of the flexible screen is fixedly connected with a sliding assembly, and the sliding assembly is connected with one end, away from the storage blocking member, of the at least one elastic assembly; and wherein the sliding assembly is a sliding plate, and the sliding plate completely covers the flexible screen in a direction perpendicular to an unfolding direction of the flexible screen; and the storage blocking member is provided with a sliding groove, and the sliding assembly slides in the sliding groove when the storage block member pulls a second end of the at least one elastic assembly opposite to the first end; and two ends of the sliding groove corresponding to a direction perpendicular to an unfolding direction of the flexible screen are provided with guide rails, and an edge of the sliding assembly is sided along the guide rails.

8. The display apparatus according to claim 7, wherein the at least one elastic assembly comprises one elastic assembly, and the one elastic assembly is connected to a middle position of the sliding assembly in a direction perpendicular to an unfolding direction of the flexible screen.

9. The display apparatus according to claim 7, wherein the at least one elastic assembly comprises two elastic assemblies, the two elastic assemblies are arranged at two end of a side, facing the storage blocking member, of the sliding assembly, and the two elastic assemblies are symmetrical.

10. The display apparatus according to claim 7, wherein the flexible screen storage apparatus is further provided with a flexible screen winding driving apparatus.

11. The display apparatus according to claim 7, wherein a locking apparatus is further arranged in the flexible screen storage apparatus, and the locking apparatus is configured to limit an action of the flexible screen.

12. The flattening structure of the flexible screen according to claim 1, wherein the sliding groove has an opening on a surface of the storage blocking member facing the flexible screen storage apparatus.

\* \* \* \* \*